(12) United States Patent
Takasawa et al.

(10) Patent No.: US 8,147,657 B2
(45) Date of Patent: Apr. 3, 2012

(54) SPUTTERING DEVICE AND FILM FORMING METHOD

(75) Inventors: Satoru Takasawa, Sammu (JP); Sadayuki Ukishima, Sammu (JP); Noriaki Tani, Sammu (JP); Satoru Ishibashi, Sammu (JP)

(73) Assignee: Ulvac, Inc., Chigasaki-shi (JP)

( * ) Notice: Subject to any disclaimer, the term of this patent is extended or adjusted under 35 U.S.C. 154(b) by 883 days.

(21) Appl. No.: 12/136,313

(22) Filed: Jun. 10, 2008

(65) Prior Publication Data

US 2008/0245657 A1 Oct. 9, 2008

Related U.S. Application Data

(63) Continuation of application No. PCT/JP2007/050479, filed on Jan. 16, 2007.

(30) Foreign Application Priority Data

Jan. 25, 2006 (JP) .................................. 2006-16405

(51) Int. Cl.
*C23C 14/35* (2006.01)

(52) U.S. Cl. ......... 204/192.22; 204/192.12; 204/192.15; 204/298.18; 204/298.26

(58) Field of Classification Search ............. 204/192.12, 204/192.15, 192.18, 192.22, 298.18, 298.26
See application file for complete search history.

(56) References Cited

U.S. PATENT DOCUMENTS 5,169,509 A * 12/1992 Latz et al. ................ 204/298.03
5,415,757 A * 5/1995 Szcyrbowski et al. ... 204/298.08
6,338,777 B1 * 1/2002 Longstreth White .... 204/192.15

FOREIGN PATENT DOCUMENTS

| JP | 59-53680 | * | 3/1984 |
| JP | 61-192032 | | 8/1986 |
| JP | 03-13575 | | 1/1991 |
| JP | 2003-82456 A1 | | 3/2003 |
| JP | 2006-089850 | | 4/2006 |
| JP | 2006-89850 A1 | | 4/2006 |

OTHER PUBLICATIONS

Swarnalatha et al. "Twin facing target sputtering system for the deposition of multilayer and alloy films", Vacuum, vol. 48, No. 1, pp. 15-19, No Month 1997.*
International Search Report for International Application PCT/JP07/050479 dated Feb. 9, 2007.
Notice of Reasons for Refusal dated Oct. 26, 2010, issued for the Japanese patent application.

* cited by examiner

*Primary Examiner* — Rodney McDonald
(74) *Attorney, Agent, or Firm* — Kratz, Quintos & Hanson, LLP

(57) ABSTRACT

A sputtering apparatus according to the present invention is provided with first to fourth targets. The first and the second targets are disposed so that their surfaces face each other. The third and the fourth targets are also disposed so that their surfaces face each other. When a dielectric film is formed, sputtering is alternately performed on the first and the second targets and on the third and the fourth targets. When sputtering is performed on two of the targets having surfaces that face each other, the remaining two targets function as a ground. As a result, abnormal discharges are inhibited.

10 Claims, 5 Drawing Sheets

US 8,147,657 B2

SPUTTERING DEVICE AND FILM FORMING METHOD

The present invention is a Continuation of International Application No. PCT/JP2007/050479 filed Jan. 16, 2007, which claims priority to Japan Patent Document No. 2006-016405, filed on Jan. 25, 2006. The entire disclosures of the prior applications are hereby incorporated by reference herein in their entireties

BACKGROUND

The present invention generally relates to a sputtering apparatus and a film forming method using the sputtering apparatus.

As a method for producing a dielectric film (such as oxide film), a production method by means of reactive sputtering, in which active gas is introduced to a sputtering space and sputtering materials obtained from a target react to the active gas and a compound film is deposited, has been known.

In this reactive sputtering, a cathode is usually disposed in parallel with a substrate. Thus, sputtering particles that are discharged perpendicularly from a target on the cathode are incident on the substrate. Since such sputtering particles have high energy, there has been a problem in that, when a dielectric film is formed on the substrate, the dielectric film becomes damaged.

Conventionally, in order to solve this problem, a producing method by means of facing target sputtering has been proposed. In this producing method, a pair of targets are disposed so as to face each other with a space between them, and Penning discharge is applied by generating a magnetic field in a direction perpendicular to the targets (Patent: JP S62-56575B).

Reference numeral 110 in FIG. 7 indicates a conventional facing target sputtering apparatus. The sputtering apparatus 110 is provided with a vacuum chamber 111, and in the vacuum chamber 111, two targets 121a and 121b are disposed such that their surfaces are in parallel and face each other with a certain space between them. The back faces of the targets 121a and 121b are mounted to cathode electrodes 122a and 122b, respectively. Magnetic members 115a and 115b are disposed on the back face of the cathode electrodes 122a and 122b. The magnetic members 115a and 115b are configured by installing ring-shaped magnets 123a and 123b to yokes 129a and 129b.

The magnets 123a and 123b are respectively disposed that one of the magnetic poles thereof is directed toward the targets 121a and 121b and the other magnetic pole thereof is directed in the opposite direction, to the targets. Furthermore, the magnets 123a and 123b are disposed in such a manner that different polarity of magnetic poles of the magnets 123a and 123b are directed to the targets 121a and 121b.

In other words, if the north pole of the magnet 123a is directed toward the target 121a, the south pole of the other magnet 123b is directed toward the target 121b. Since the magnets 123a and 123b are in a ring shape, magnetic lines of force are formed in a cylindrical shape between the magnets 123a and 123b.

The inside of the vacuum chamber 111 is evacuated by vacuum evacuation system 116; sputtering gas is introduced from gas feeding system; and voltage is applied to the target 121a and 121b. Consequently, plasma of sputtering gas is generated in the space interposed between the targets 121a and 121b so that the surface of the targets 121a, 121b are sputtered.

An object to be film formed 113 is disposed lateral to the space sandwiched between the targets 121a and 121b. A film is formed on the surface of the object to be film formed 113 by the sputtering particles that are obliquely sputtered from the targets 121a and 121b in order to discharge to the inside of the vacuum chamber 111.

With the sputtering apparatus 110, particles having high-speed energy can be confined between a pair of the targets using the magnetic lines of force in a cylindrical shape. Thus, it is possible to prevent incidence of high-speed energy particles on a substrate, and thereby a film with less damage can be produced.

Although only inert gas is used as sputtering gas in conventional sputtering, in the above-mentioned reactive sputtering, active gas is used in addition to inert gas as sputtering gas, and a film is formed with a reacted product of the solid particles that are sputtered from the targets and the active gas.

When a thin oxide film is to be formed, oxygen gas as active gas is simultaneously introduced to sputtering gas. For this reason, the surfaces of the targets become oxidized; and, furthermore, a dielectric film is deposited on a protective plate, a ground shield, and others so that abnormal arc discharge may occur frequently.

In order to eliminate abnormal arc discharges, it has been conventionally proposed that an alternating current electric field of which phase are shifted by 180 degrees be applied to the two targets facing each other with a (JP H11-29862A).

However, even if the alternating current electric field is applied, when a dielectric film is continued to be formed, a dielectric film is deposited on the target surface, the protective plate, the inner walls of a cathode box (sputtering chamber), and others; and abnormal arc discharges occurred.

Furthermore, there has been a problem in that when the dielectric film is continued to be formed and the dielectric film is deposited on the entire inner walls of the cathode box, plasma which search a ground potential spouts from inside of the cylindrical magnetic lines of force into the space that is on the side where the substrate is disposed, and thus the substrate is damaged by plasma. These problems are disclosed in JPB S62-56575 and JPA H11-29862, for example.

SUMMARY OF THE INVENTION

The present invention is made in order to solve the above-mentioned problems, and it is an object thereof to provide a sputtering apparatus that does not cause abnormal discharges even when a dielectric film is formed.

In order to address the above-mentioned problems of the conventional art, the present invention is a sputtering apparatus having first and second targets that are disposed such that their surfaces face each other, a third target disposed such that its surface is in parallel with the surface of the first target, a fourth target disposed such that its surface is in parallel with the surface of the second target and the fourth target faces the third target, and first to fourth cathode electrodes are disposed in the back of the first to fourth targets, wherein a film is formed on the surface of an object to be film formed at a location that faces a space between the first and the second targets.

In an aspect of the present invention, a sputtering apparatus is constructed such that the surfaces of the third and the fourth targets are located on the same plane where the surfaces of the first and the second targets are respectively positioned.

In another aspect of the present invention, a sputtering apparatus is constructed such that the first and the second targets are disposed between the object to be film formed on which the film is being formed and the third and the fourth targets.

In another aspect of the present invention, the sputtering apparatus includes a transfer mechanism for transferring the object to be film formed while the object to be film formed faces the space positioned between the first and the second targets.

In another aspect of the present invention, the sputtering apparatus is constructed such that the third and the fourth targets are disposed so that the object to be film formed on which the film is being formed faces a space between the third and the fourth targets.

In another aspect of the present invention, the sputtering apparatus is provided with a transfer mechanism for transferring the object to be film formed in such a manner that the object to be film formed simultaneously faces the space between the first and the second targets as well as the space between the third and the fourth targets.

In another aspect of the present invention, the sputtering apparatus includes a sputtering power source that is connected with the first to the fourth cathode electrodes and outputs an alternating current voltage, the sputtering power source is connected so as to apply a voltage of the same polarity and the same size to the first and the second cathode electrodes. Also, the sputtering power source is connected so as to apply a voltage having the same polarity and of the same size to the third and the fourth cathode electrodes.

In another aspect of the present invention, the sputtering apparatus is constructed such that the sputtering power source outputs an alternate current voltage in such a manner that, when a negative voltage is applied to the first and the second cathode electrodes, a voltage that is positive relative to the first and the second cathode electrodes is applied to the third and the fourth cathode electrodes; and in such a manner, when a negative voltage is applied to the third and the fourth cathode electrodes, a voltage that is positive relative to the third and the fourth cathode electrodes is applied to the first and the second cathode electrodes.

In another aspect of the present invention, the present invention is a method for forming a dielectric film using a sputtering apparatus, the sputtering apparatus including first and second targets disposed such that their surfaces face each other, a third target disposed such that its face is in parallel with the surface of the first target, and a fourth target disposed such that its surface is in parallel with the surface of the second target and faces the third target, the method for forming the dielectric film on an object to be film formed at a location facing a space positioned between the first and the second targets including, alternately repeating a first voltage period in which a negative voltage is applied to the first and the second targets and a voltage that is positive relative to the first and the second targets is applied to the third and the fourth targets, and a second voltage period in which a negative voltage is applied to the third and the fourth targets and a voltage that is positive relative to the third and the fourth targets is applied to the first and the second targets.

In another aspect of the present invention, a film forming method is constructed such that the dielectric film is formed by moving the object to be film formed while the object to be film formed faces a space positioned between the first and the second targets.

In another aspect of the present invention, a film forming method is constructed such that the first and the second voltage periods are respectively repeated at least twice between the time at which the leading end of the object to be film formed in the moving direction reaches a location that faces a space between the first and the second targets and the time at which the tail end of the object to be film formed in the moving direction completes passing through a location that faces a space between the first and the second targets.

The present invention is constructed described above, and the first to the fourth targets are respectively electrically connected to the first to the fourth cathode electrodes disposed in the back face thereof and so that the voltage identical to the voltage which is applied to the cathode electrodes disposed in the back side thereof is applied to the first to the fourth targets.

When sputtering is performed by applying a negative voltage to the first and the second target, sputtering particles are discharged into a space between the first and the second targets, and when sputtering is performed by applying a negative voltage to the third and the fourth targets, sputtering particles are discharged into a space between the third and the fourth targets.

Since the first and the second targets are located at a position between a transfer path and the third and the fourth targets, sputtering particles discharged from the third and the fourth targets pass through the space between the first and the second targets and reach the object to be film formed.

Among the first to fourth targets, when sputtering is performed by applying negative voltage to two facing targets, positive voltage relative to the negative voltage is applied to the other two facing targets so that the targets on which sputtering is not performed serve as ground for the targets on which sputtering is performed. As a result, abnormal arc discharge is inhibited even if the inner wall of sputtering chamber and the ground shield are covered with the dielectric film.

DETAILED DESCRIPTION OF THE EMBODIMENTS

Figure 1:
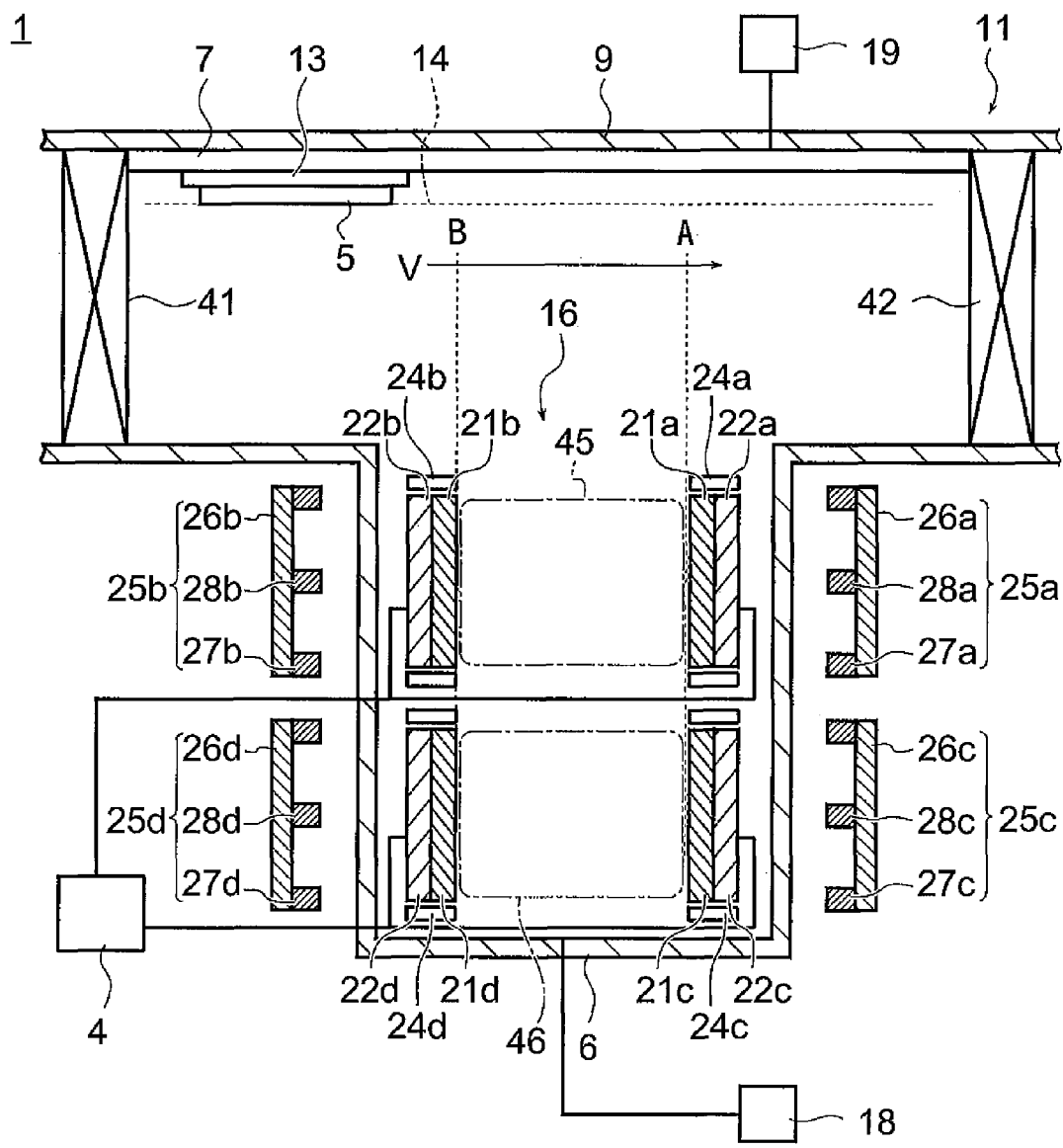
FIG. 1 is a cross-sectional view of a sputtering apparatus according to the present invention.

Reference numeral 1 in FIG. 1 indicates a sputtering apparatus according to Embodiment 1 of the present invention.

The sputtering apparatus 1 is a vertical style apparatus of inter-back type, and is provided with a vacuum chamber 11. The vacuum chamber 11 is provided with a transfer chamber 9 and a sputtering chamber 6 (discussed below) in which sputtering is performed. In the transfer chamber 9, a transfer mechanism 7 for transferring a substrate 5, which is an object to be film formed, is disposed in the transfer chamber 9.

The transfer chamber 9 is provided with a transfer inlet 41 and a transfer outlet 42. The transfer inlet 41 is connected with a load/unload chamber (not shown) and the transfer outlet 42 is connected to a post-processing chamber (not shown).

The substrate 5, which is an object to be film formed, is held by a carrier 13 after being transferred from the transfer in/out chamber into the transfer chamber 9 through the transfer inlet 41. The transfer mechanism 7 moves the carrier 13 together with the substrate 5 from the transfer inlet 41 to the transfer outlet 42 while maintaining a state in which the surface to be film formed of the substrate 5 stays within a plane 14.

An opening 16 is provided on the wall surface of the transferring chamber 9 positioned between the transfer inlet 41 and transfer outlet 42. The sputtering chamber 6 is connected air tight with the transfer chamber 9 through the opening 16. The substrate 5 passes the location opposed to the opening 16 while in a state in which the surface to be film formed faces the opening 16.

Figure 2:
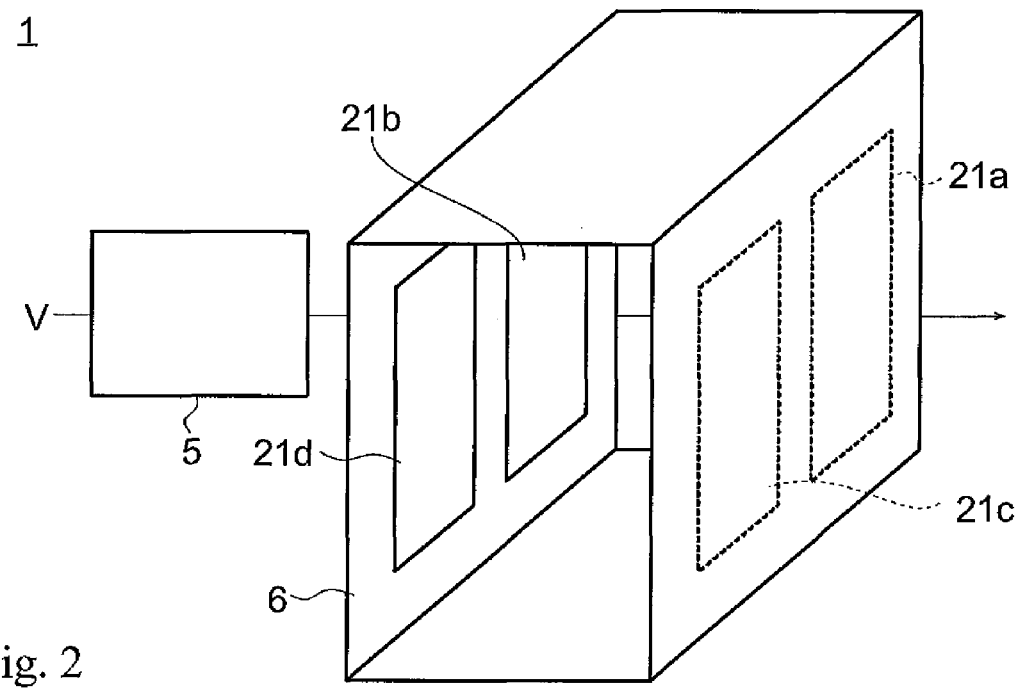
FIG. 2 is a perspective view that schematically illustrates a sputtering chamber of a sputtering apparatus according to Embodiment 1 of the present invention.

First to fourth targets 21a to 21d in a plate shape are disposed inside the sputtering chamber 6. The first and the second targets 21a and 21b are positioned such that their surfaces face each other, and the third and the fourth targets 21c and 21d are also positioned such that their surfaces face each other (FIG. 2).

The surfaces of the third and the fourth targets 21c and 21d are in parallel with the surfaces of the first and the second targets 21a and 21b, respectively. In this example, the surfaces of the third and the fourth targets 21c and 21d are respectively located within the same plane in which the surfaces of the first and the second targets 21a and 21b are located.

The first and the second targets 21a and 21b are disposed closer to the opening 16 than the third and the fourth targets 21c and 21d. The path of the linear movement of the substrate 5 is located on an extension of a line that connects the center of a space 45 between the first and the second targets 21a and 21b with the center of a space 46 between the third and the fourth targets 21c and 21d. The space 46 between the third and the fourth targets 21c and 21d faces the opening 16 through the space 45 between the first and the second targets 21a and 21b.

First to fourth magnetic members 25a to 25d are provided on the back face side of the first to the fourth targets 21a to 21d, respectively. A configuration is adopted such that the first to the fourth magnetic members 25a to 25d form magnetic lines of force on the surfaces of the first to the fourth targets 21a to 21d.

First to fourth cathode electrodes 22a to 22d are provided on the back face of the first to the fourth targets 21a to 21d, respectively. The first to the fourth targets 21a to 21d are installed in close contact with the surfaces of the first to the fourth cathode electrodes 22a to 22d, respectively.

Ground shields 24 are provided around the first to the fourth targets 21a to 21d, respectively. The ground shields 24 are connected with the same ground potential as that of the vacuum chamber 11.

A power source 4 is disposed outside of the vacuum chamber 11. A vacuum evacuation system 19 vacuum evacuates the inside of the vacuum chamber 11. Sputtering gas and, if necessary, active gas is introduced from a gas feed system 18 to the inside of the vacuum chamber 11 so that a film forming ambience is formed. The configuration is adopted such that, when a voltage is applied from the power source 4 to the cathode electrodes 22a to 22d while in a state such that magnetic lines of force have been formed on the surfaces of the first to the fourth targets 21a to 21d, a voltage is applied to the first to the fourth targets 21a to 21d and sputtering is performed on the surfaces of the first to the fourth targets 21a to 21d so as to discharge sputtering particles.

Reference letter V in FIG. 1 indicates a moving direction in which the substrate 5 moves. Reference letter A in FIG. 1 indicates a plane on which the surfaces of the first and the third targets 21a and 21c are located. Reference letter B in FIG. 1 indicates a plane on which the surfaces of the second and the fourth targets 21b and 21d are located. The planes A and B are perpendicular to the moving direction V.

The substrate 5 moves while maintaining a certain distance between the substrate 5 and the space 45 and 46 interposed between the first through the fourth targets 21a to 21d. The sputtering particles that are discharged from the surfaces of the first to the fourth targets 21a to 21d are incident approximately perpendicularly on the surface to be film formed of the substrate 5 so that a film is formed.

Hereinafter, the configuration of a sputtering apparatus 1 when a dielectric film is formed will be described.

First to fourth magnetic members 25a to 25d are provided with first to fourth ring magnets 27a to 27d that are in a ring shape. The first to the fourth ring magnets 27a to 27d are disposed such that the planes on which the rings are located are approximately in parallel with the surfaces of the first to the fourth targets 21a to 21d, and so that the center axis lines of the rings are approximately perpendicular to the surfaces of the first to the fourth targets 21a to 21d.

The first to the fourth ring magnets 27a to 27d are provided with magnetic poles formed on their surfaces that are directed toward the first to the fourth targets 21a to 21d.

The first and the second ring magnets 27a and 27b are disposed such that their magnetic poles are directed toward the first and the second targets 21a and 21b, and the magnetic poles facing the first and second targets 21a and 21b are different polarities. The third and the fourth ring magnets 27c and 27d are also disposed such that their magnetic poles are directed toward the third and the fourth targets 21c and 21d, and their magnetic poles facing the third and fourth targets 21c and 21d are different polarities.

Magnetic lines of force in a cylindrical shape are formed between the first and the second ring magnets 27a and 27b so as to pass through the surfaces of the first and the second targets 21a and 21b, and magnetic lines of force in a cylindrical shape are formed between the third and the fourth ring magnets 27c and 27d so as to pass through the surfaces of the third and the fourth targets 21c and 21d.

The planar shapes of the first to the fourth targets 21a to 21d are smaller than the outer circumference of the rings of the first to the fourth ring magnets 27a to 27d so that the first to the fourth targets 21a to 21d are disposed so as not to extrude from the outer circumference of the ring magnets 27a to 27d that are positioned back side of the first to the fourth targets, respectively.

The first and the second targets 21a and 21b and the space 45 therebetween are surrounded by the cylindrical magnetic lines of force formed by the first and the second ring magnets 27a and 27b. The third and the fourth targets 21c and 21d and the space 46 therebetween are surrounded by the cylindrical magnetic lines of force that are formed by the third and the fourth magnetic members 25c and 25d. Thus, the space 45 between the first and the second targets 21a and 21b, and the space 46 between the third and the fourth targets 21c and 21d are surrounded by individual cylindrical magnetic lines of force.

Among the magnetic members 25a to 25d, the magnetic members adjacently located on the same planes A or B, include magnetic poles having the same polarity directed toward the targets 21a to 21d. In other words, the magnetic poles of the first and the third ring magnets 27a and 27c directed toward the first and the third targets 21a and 21c are of the same polarity. The magnetic poles of the second and the fourth ring magnets 27b and 27d that are directed toward the second and the fourth targets 21b and 21d are also of the same polarity.

Magnetic lines of force that penetrate the surfaces of the first to the fourth targets 21a to 21d are not formed between the first and the third ring magnets 27a and 27c as well as between the second and the fourth ring magnets 27b and 27d; and thus, the magnetic flux density of the cylindrical magnetic lines of force does not decrease.

First to fourth yokes 26a to 26d are provided on the back face side of the first to the fourth ring magnets 27a and 27d, respectively. The first to the fourth ring magnets 27a to 27d are in such a state that the surface having a polarity opposite to the polarity on the sides of the first to the fourth target 21a to 21d, are in close contact with the first to the fourth yokes 26a to 26d, respectively. The magnetic lines of force do not expand to the opposite sides of the first to the fourth targets 21a to 21d.

In this example, first to fourth bar magnets 28a to 28d are provided inside the ring of the first to the fourth ring magnets 27a to 27d, respectively. The first to the fourth bar magnets 28a to 28d are disposed such that the magnetic poles of the same polarity as that of the surrounding ring magnets 27a to 27d are directed toward the first to the fourth targets 21a to 21d.

Therefore, the first to the fourth magnetic members 25a to 25d have a smaller spacing between the magnet poles on the side of the first to the fourth targets 21a to 21d, compared to when the bar magnets do not exist. The magnetic lines of force that penetrate through the surfaces of the first to the fourth targets 21a to 21d do not return to the same magnetic members 25a to 25d.

Thus, the density of the cylindrical magnetic lines of force becomes higher than when bar magnets do not exist. As mentioned above, the magnetic flux density of the cylindrical magnetic lines of force between the first and the second ring magnets 27a and 27b, as well as between the third and the fourth ring magnets 27c and 27d, is high. Thus, during the above-mentioned sputtering, plasma is confined inside of the cylindrical magnetic lines of force.

The transfer chamber 9 and the sputtering chamber 6 are connected to the ground potential.

The power source 4 is an alternating current power source and has a configuration such that, when a voltage that is negative relative to the ground potential is applied to the first and the second targets 21a and 21b, a voltage that is positive relative to the first and the second targets 21a and 21b is applied to the third and the fourth targets 21c and 21d. Also, when a voltage that is negative relative to the ground potential is applied to the third and the fourth targets 21c and 21d, a voltage that is positive relative to the third and the fourth targets 21c and 21d is applied to the first and the second targets 21a and 21b.

Therefore, sputtering is alternately performed on the surfaces of the first and the second targets 21a and 21b and on the surfaces of the third and the fourth targets 21c and 21d.

The magnitude of the voltage applied to the first and the second targets 21a and 21b stays the same in both positive and negative. Similarly, the magnitude of the voltage applied to the third and the fourth targets 21c and 21d also stays the same in both positive and negative. Thus, no potential differences occur between two of the targets 21a to 21d that face each other. As a result, uniform sputtering is performed on the first and the second targets 21a and 21b, as well as on the third and the fourth targets 21c and 21d.

When a dielectric film is formed, the first to the fourth targets 21a to 21d formed of electrically conductive materials are installed to the first to the fourth cathode electrodes 22a to 22d. The vacuum chamber 11 is vacuum evacuated to a predetermined pressure. While vacuum evacuation is continued, active gas is introduced together with sputtering gas into the vacuum chamber 11 so that a film forming ambience is formed.

The active gas is a gas of which reacts with the electrically conductive materials and generates dielectric materials. Here, a noble gas is used as the sputtering gas.

The transfer chamber 9 and the sputtering chamber 6 are maintained at the ground potential. While maintaining the film forming ambience, an alternating current voltage from the power source 4 is applied to the first to the fourth targets 21a to 21d. When the alternating current voltage applies a voltage that is negative relative to the ground potential to the first and the second targets 21a and 21b, a voltage that is positive relative to the first and the second targets 21a and 21b is applied to the third and the fourth targets 21c and 21d. Also, when a voltage that is negative relative to the ground potential is applied to the third and the fourth targets 21c and 21d, a voltage that is positive relative to the third and the fourth targets 21c and 21d is applied to the first and the second targets 21a and 21b.

As a result, sputtering is performed on the surfaces of the first and the second targets 21a and 21b, and on the surfaces of the third and the fourth targets 21c and 21d, alternately.

The substrate 5 is loaded into the transfer chamber 9 in advance. While sputtering is continued on the surfaces of the first and the second targets 21a and 21b and on the surfaces of the third and the fourth targets 21c and 21d, the substrate 5 is moved by the above-mentioned transfer mechanism 7.

When the substrate 5 reaches the location facing the opening 16, the substrate 5 faces the space 45 between the first and the second targets 21a and 21b through the opening 16, and the sputtering particles start to reach the surface to be film formed.

The frequency of the alternating current voltage output by the power source 4 has been set such that sputtering is performed a plurality of times on the surfaces of the first and the second targets 21a and 21b, and on the surfaces of the third and the fourth targets 21c and 21d, respectively, during the leading end of the substrate 5 in the moving direction V reaches the location that faces the opening 16 and the tail end thereof in the moving direction V finishes passing through the location that faces the opening 16.

The third and the fourth targets 21c and 21d are located farther from the opening 16 than the first and the second targets 21a and 21b. Thus, the sputtering particles discharged from a location far from the opening 16 and the sputtering particles discharged from a location near the opening 16 alternately reach the single substrate 5 at a plurality of times respectively.

The sputtering particles discharged at the location far from the opening 16 reach the substrate 5 at a lower rate than the sputtering particles discharged at the location near the opening 16. However, in a film forming method according to the present invention, the sputtering particles discharged from the location far from the opening 16 and the sputtering particles discharged from the location near the opening 16 alternately reach the same substrate 5 at a plurality of times. As a result, the amount of the sputtering particles that reach respective portions of the surface to be film formed is averaged.

The sputtering particles, during their reach from the surfaces of the first to the fourth targets 21a to 21d to the surface to be film formed of the substrate 5 or after they reach the surface to be film formed of the substrate 5, react with active gas so that dielectric materials are generated. Therefore, a dielectric film is formed on the surface of the substrate 5. As mentioned above, the amount of the sputtering particles that reach each of the portions of the surface to be film formed of the substrate 5 has been averaged. Accordingly, a dielectric film having an even thickness is formed on the surface to be film formed.

When sputtering is continued on the first to the fourth targets 21a to 21d while supplying active gas, a dielectric film is also formed on the inner walls of the sputtering chamber 6 and the surfaces of the ground shields 24. As a result, the sputtering chamber 6 and the ground shields 24 cease to function as a ground.

In the present invention, when sputtering is performed on the surfaces of two of the targets 21a to 21d facing each other, the remaining two of the targets 21a to 21d facing each other are in a voltage that is positive relative to the targets 21a to 21d on which sputtering is performed. As a result, the targets 21a to 21d on which sputtering is not performed function as a ground.

Furthermore, sputtering is alternately performed on two of the targets 21a to 21d facing each other and on the remaining two of the targets 21a to 21d facing each other. Even when a dielectric film is attached to the surfaces of the targets 21a to 21d, sputtering removes the dielectric film. For this reason, the sputtering chamber 6 always has a ground. The ground prevents abnormal discharges.

The transfer chamber 9 is connected at the ground potential. When the inner walls of the sputtering chamber 6 is covered with a dielectric film, plasma in the spaces 45 and 46 that are between the first to the fourth targets 21a to 21d become attracted to the transfer chamber 9 in search of the ground potential.

However, the targets 21a to 21d that function as the ground are located closer compared to the transfer chamber 9. While sputtering is performed on the first and the second targets 21a and 21b, plasma in the space 45 therebetween is not drawn out from the opening 16, but drawn in the space 46 between the third and the fourth targets 21c and 21d.

On the other hand, while sputtering is performed on the third and the fourth targets 21c and 21d, plasma in the space 46 therebetween is drawn in the space 45 between the first and the second targets 21a and 21b positioned in front of the opening 16. Thus, in either case, plasma is not drawn into the transfer chamber 9 from the opening 16. The substrate 5 is not damaged by plasma.

In the sputtering apparatus 1 according to Embodiment 1, the space 46 between the third and the fourth targets 21c and 21d faces the opening 16 through the space 45 between the first and the second targets 21a and 21b. However, the present invention is not limited to such a configuration.

Figure 3:
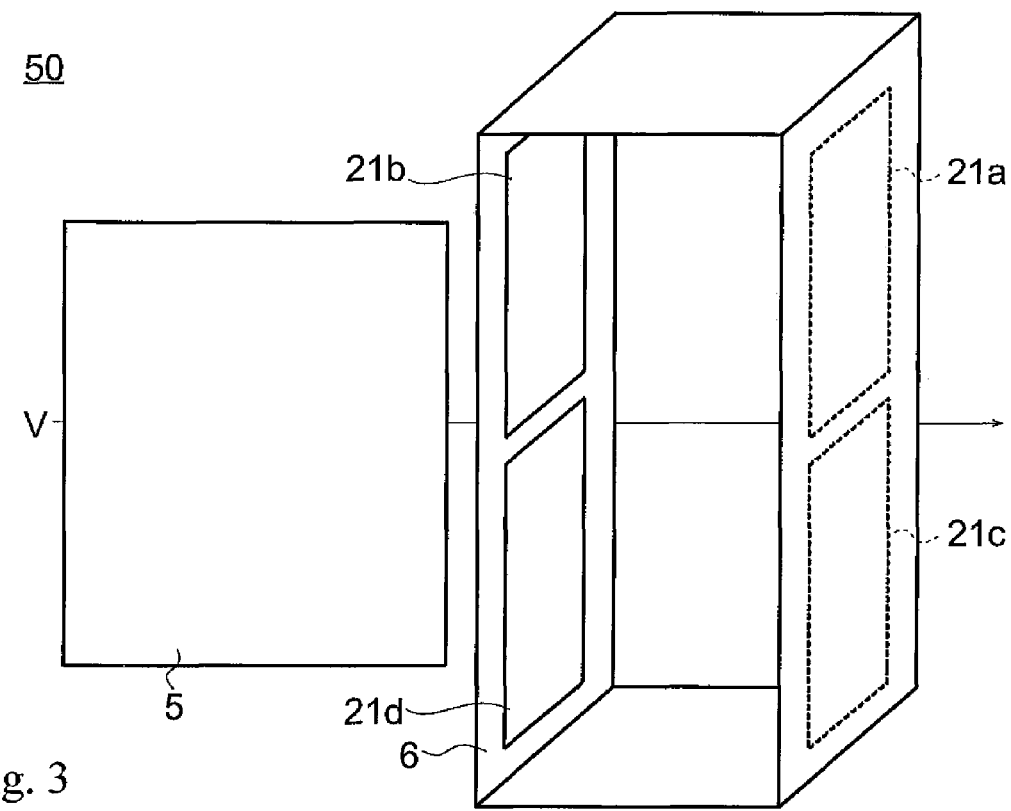
FIG. 3 is a perspective view that schematically illustrates a sputtering chamber of a sputtering apparatus according to Embodiment 2 of the present invention.

Reference numeral 50 in FIG. 3 indicates a sputtering apparatus according to Embodiment 2. The sputtering apparatus 50 is the same as the sputtering apparatus according to Embodiment 1 such that the surfaces of third and fourth targets 21c and 21d are on a face (on the same plane in this example) that is in parallel with the surfaces of first and second targets 21a and 21b.

However, the third and the fourth targets 21c and 21d are disposed such that their distances to an opening 16 are approximately the same as the distances between the first and the second targets 21a and 21b and the opening 16. A space 46 between the third and the fourth targets 21c and 21d directly face the opening 16, like a space 45 between the second targets 21a and 21b.

Thus, in the sputtering apparatus 50 according to Embodiment 2, sputtering particles discharged from the third and the fourth targets 21c and 21d do not pass through the space 45 between the first and the second targets 21a and 21b. The sputtering particles are sputtered directly through the opening 16 toward a substrate 5.

In the sputtering apparatus 50 according to Embodiment 2, similarly to the sputtering apparatus 1 according to Embodiment 1, first to fourth magnetic members 25a to 25d are disposed in the back face side of the first to the fourth targets 21a to 21d (in this example, the first to the fourth magnetic members 25a to 25d are not shown). These magnetic members 25a to 25d form magnetic lines of force that pass through the surfaces of the first to the fourth targets 21a to 21d, respectively.

In the sputtering apparatus 50 according to Embodiment 2, similarly to the sputtering apparatus according to Embodiment 1, the first to the fourth magnetic members 25a to 25d are provided with first to fourth ring magnets 27a to 27d. Magnetic lines of force in a cylindrical shape that surround the space 45 positioned between the first and the second targets 21a and 21b (as well as magnetic lines of force in a cylindrical shape that surround the space 46 positioned between the third and the fourth targets 21c and 21d) are respectively formed.

Hereinafter, a step of forming a dielectric film using the sputtering apparatus 50 will be described. The first to the fourth targets 21a to 21d formed of electrically conductive materials are installed to cathode electrodes 22a to 22d, and, similar to when a dielectric film is formed using the sputtering apparatus 1 according to Embodiment 1, a film forming ambience is formed.

While in a state that the transfer chamber 9 and a sputtering chamber 6 are at the ground potential, an alternating current voltage is applied to the first to the fourth targets 21a to 21d.

When a voltage that is negative relative to the ground potential is applied to the first and the second targets 21a and 21b, a voltage that is positive relative to the first and the second targets 21a and 21b is applied to the third and the fourth targets 21c and 21d.

When a voltage that is negative relative to the ground potential is applied to the third and the fourth targets 21c and 21d, a voltage that is positive relative to the third and the fourth targets 21c and 21d is applied to the first and the second targets 21a and 21b. Sputtering is alternately performed on the surfaces of the first and the second targets 21a and 21b and on the surfaces of the third and the fourth targets 21c and 21d.

In the sputtering apparatus 50, the targets 21a to 21d on which sputtering is not performed also function as a ground. For this reason, abnormal discharges are prevented. Also, plasma is not drawn out into the transfer chamber 9 from the spaces 45 and 46 that are between the first to the fourth targets 21a to 21d. Thus, the substrate 5 is not damaged.

In the sputtering apparatus 50 according to Embodiment 2, the third and the fourth targets 21c and 21d directly face the opening 16. Accordingly, compared to the sputtering apparatus 1 according to Embodiment 1, the sputtering particles are discharged in a wider range. The sputtering apparatus 50 according to Embodiment 2 is more suitable for forming a film on the substrate 5 that has a large area to be film formed than the sputtering apparatus 1 according to Embodiment 1. However, the film thickness distribution of the film formed by the sputtering apparatus 1 according to the embodiment is more uniform than that of the sputtering apparatus 50 according to Embodiment 2.

As mentioned above, examples were described in which the substrate 5 moves on a straight line in the transfer chamber 9. However, the present invention is not limited to such a configuration. Reference numeral 61 in FIG. 4 indicates another example of a transfer mechanism used in the present invention.

The transfer mechanism 61 is provided with a transfer drum 67. The transfer drum 67 is disposed at a location that faces an opening 16 inside of a transfer chamber 9 so that its side face is directed toward the opening 16. The transfer drum 67 is connected to a driving mechanism (not shown). The transfer drum 67 is constructed such that, when the driving mechanism is operated, the transfer drum 67 rotates with its center axis line as the center while maintaining the relative positional relationship between its center axis line and the opening 16.

When the substrate 5 is transferred into the transfer chamber 9 from the load/unload chamber, the substrate 5 is mounted on the side face of the transfer drum 67. When the transfer drum 67 rotates, the substrate 5 moves rotationally along the circumference of a circle with its center at the center axis line of the transfer drum 67. The substrate 5, as it moves, passes through the location that faces the opening 16.

Figure 4:
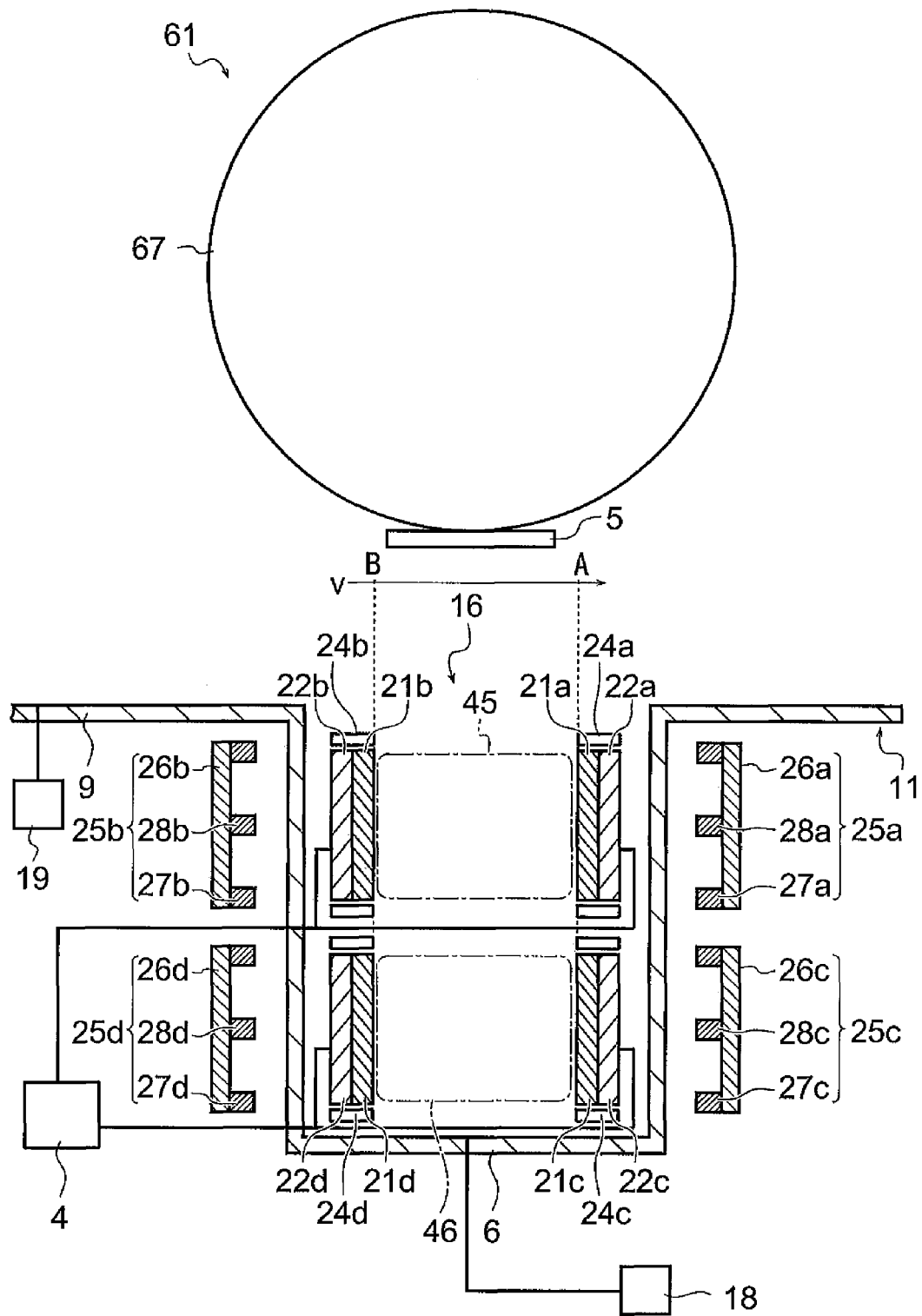
FIG. 4 is a cross-sectional view that illustrates another example of a transfer mechanism.

Reference letter v in FIG. 4 indicates the moving direction of the substrate 5. When the moving direction v becomes perpendicular to a plane A on which the surfaces of the first and the third targets 21a and 21c are located and a plane B on which the surfaces of the second and the fourth targets 21b and 21d are located, the respective distances between the center of the substrate 5 and the first and the second targets 21a and 21b become the same.

The respective distances between the center of the substrate 5 and the third and the fourth targets 21c and 21d have also been set to be the same. As a result, the amount of sputtering particles become uniform while the substrate 5 approaches and moves away from the opening 16.

The transfer mechanism 61 may be used in both of the above-mentioned sputtering apparatuses 1 and 50 according to Embodiments 1 and 2.

As mentioned above, examples were described in which four targets are used. However, the present invention is not limited to such a configuration. In addition to the first to the fourth targets 21a to 21d, one or more pairs of targets facing each other may be disposed in a sputtering chamber 6.

Also, the number of the sputtering chamber 6 is not limited to one. Two or more sputtering chambers may be connected with the same transfer chamber 9 and two or more types of films may be deposited on a surface to be film formed of a substrate 5 while the substrate 5 moves inside of the transfer chamber 9.

Specific examples of the first to the fourth targets 21a to 21d used for forming the above-mentioned dielectric film will be described. For example, metal targets (such as, iron and aluminum), and silicon targets are included. To silicon targets, one or more types of dopants (such as, boron or the like) may be added as necessary.

The type of active gas is also not particularly limited. For example, oxidizing gas for forming oxides by oxidizing electrically conductive materials and nitriding gas for forming nitride by nitriding electrically conductive materials are included. Either one or both of oxidizing gas and nitriding gas may be used. For the oxidizing gas, at least one of $O_2$, $O_3$, $H_2O$, and $CO_2$ may be used. For the nitriding gas, at least one of $N_2$ and $NH_4$ may be used.

Also, carrier gas may be introduced to a vacuum chamber 11 together with the active gas and the sputtering gas. The density of the active gas and the sputtering gas can be adjusted by the carrier gas.

The type of the sputtering gas is also not particularly limited. For example, noble gas (such as, Ar, Ne and Kr) may be used.

Dielectric films that can be formed with the sputtering apparatuses 1 and 50 according to the present invention include thin $SiO_2$ film, thin $Al_2O_3$ film, thin $SiN_x$ film, thin ITO film, thin $SnO_2$ film, thin $ZnO_x$ film, and IZO film.

Conductive materials may not be used for the first to fourth targets 21a to 21d. For example, a dielectric film may be formed using the first to the fourth targets 21a to 21d that are made from dielectric materials. In this case, a film forming ambience may be formed without introducing active gas. Also, a film forming ambience may be formed by introducing active gas in order to supply oxygen atoms and nitrogen atoms.

In addition, the sputtering apparatuses 1 and 50 according to Embodiments 1 and 2 may be used not only for forming a dielectric film but also for forming an electrically conductive film.

In this case, targets made from electrically conductive materials are used as first through the fourth targets 21a to 21d. Sputtering is performed on the first to the fourth targets 21a to 21d without introducing active gas (such as, oxidizing gas).

When a conductive film is formed, a dielectric film is not formed on the inner walls of a sputtering chamber 6 and the surfaces of ground shields 24. For this reason, it is not necessary to capture plasma in spaces 45 and 46 that are between first to fourth targets 21a to 21d. Therefore, sputtering may be simultaneously performed on the first to the fourth targets 21a to 21d by applying a negative voltage to all of the first to the fourth targets 21a to 21d.

As mentioned above, examples are described in which sputtering is alternately performed on the first and the second targets 21a and 21b and on the third and the fourth targets 21c and 21d. However, the present invention is not limited to such a configuration.

For example, among first to fourth cathode electrodes 22a to 22d, two of opposite cathode electrodes 22a to 22d are set at the ground potential same as that of the vacuum chamber 11. While this state is maintained, a voltage that is negative relative to the ground potential is applied to the remaining two cathode electrodes 22a to 22d. As a result, sputtering is performed only on the targets 21a to 21d that are on the cathode electrode 22a to 22d to which the negative voltage is applied.

In this case, the targets 21a to 21d may be installed or not installed to the cathode electrodes 22a to 22d to be set at the ground potential.

Direct current voltage can be applied to the cathode electrodes 22a to 22d to which the targets 21a to 21d to be sputtered have been installed. Furthermore, a voltage that is negative relative to the ground potential and a voltage that is positive relative to the negative voltage can be alternately applied to the cathode electrodes 22a to 22d by applying an alternating current voltage.

In the present invention, the negative voltage to be applied to the cathode electrodes 22a to 22d is a voltage that is negative relative to the ground potential at which the vacuum chamber 11 has been set. Also, a voltage that is positive relative to the cathode electrodes 22a to 22d to which the negative voltage has been applied is a negative voltage having a smaller absolute value than the negative voltage, the ground potential being similar to that of the vacuum chamber 11, or a voltage that is positive relative to the ground potential.

First to fourth targets 21a to 21d configured of the same material can be used. Also, the first to the fourth targets 21a to 21d may be configured from different materials. If different materials are used for the first to the fourth targets 21a to 21d, a film formed on the surface to be film formed of a substrate 5 becomes a composite film composed of at least two types of materials.

The voltage applied to first to fourth targets 21a to 21d may be direct current voltage, alternating current voltage, or pulsed direct current voltage (alternating current voltage). Furthermore, a superposed voltage thereof may be applied. When the first to the fourth targets 21a to 21d are configured of dielectric materials, it is preferable to apply an alternating current voltage.

The location for the disposition of the first to the fourth magnetic members 25a to 25d is not particularly limited. The first to fourth magnetic members 25a to 25d may be disposed inside or outside of a vacuum chamber 11. When the first to the fourth magnetic members 25a to 25d are disposed outside of the vacuum chamber 11 (sputtering chamber 6), it is preferable that the sputtering chamber 6 be configured of magnetic permeable materials through which magnetic lines of force can penetrate.

The shape and size of first to fourth targets 21a to 21d as well as the shape and size of first to fourth ring magnets 27a to 27d are also not particularly limited. For example, the first to the fourth targets 21a to 21d are a rectangular plate with a width of 70 mm and a length of 330 mm. The distance between the first and the second targets 21a and 21b and the distance between the third and the fourth targets 21c and 21d are 100 mm, respectively.

Hereinafter, an example of first through the fourth magnetic members 25a to 25d that are disposed in the back side of the first to the fourth targets 21a to 21d will be described. The width of the rings of first to fourth ring magnets 27a to 27d is 10 mm. The outer circumference of the rings is in a rectangular shape with a width of 90 mm and a length of 340 mm. The first to the fourth yokes 26a to 26d are in a rectangular plate shape having a width of 90 mm and a length of 340 mm. The first to the fourth bar magnets 28a to 28d are in a rectangular shape having a width of 10 mm and a length of 270 mm.

In the first to the fourth magnetic members 25a to 25d, the distance between the shorter sides of the first to the fourth bar magnets 28a to 28d and the inner circumference of the rings of the first to the fourth ring magnets 27a to 27d is 25 mm. The distance between the longer sides of the first to the fourth bar magnets 28a to 28d and the inner circumference of the rings of the first to the fourth ring magnets 27a to 27d is 30 mm.

The distance between the faces on the side, on which sputtering is performed, of the first to the fourth targets 21a to 21d and the first to the fourth magnetic members 25a to 25d is, for example, 30 mm.

Also, the distance between an opening 16 and a transfer path of a substrate 5 is not particularly limited. For example, when first to fourth targets 21a to 21d and first to fourth magnetic members 25a to 25d of the above-mentioned size are used, the distance is 120 mm.

The type and arrangement of magnets that configure first to fourth magnetic members 25a to 25d are not particularly limited. For example, bar magnets may not be disposed inside of first to fourth ring magnets 27a to 27d. In this case, if the width of the rings of the ring magnets 27a to 27d is small, and the distance between the respective magnetic poles that are directed toward the targets 21a to 21d is short, the magnetic flux density of cylindrical magnetic lines of force does not become low even in the absence of the bar electrodes.

As mentioned above, an example was described in which the first and the third targets 21a and 21c are located on the same plane A, and the second and the fourth targets 21b and 21d are located on the same plane B, with the distance between the first and the second targets 21a and 21b and the distance between the third and the fourth targets 21c and 21d being approximately the same. However, the present invention is not limited to such a configuration. For example, the distance between third and fourth targets 21c and 21d may be smaller than the distance between first and second targets 21a and 21b. Alternatively, the distance between the third and the fourth targets 21c and 21d may be larger than the distance between the first and the second targets 21a and 21b.

As mentioned above, a sputtering apparatus was described that performs sputtering while the substrate 5 is moved. However, the present invention is not limited to such a configuration. For example, the substrate 5 may be stationary at a location that faces an opening 16 and sputtering is performed without changing the relative positional relationships between the substrate 5 and first to fourth targets 21a to 21d. A sputtering apparatus that can perform such sputtering and a film forming method are also included in the present invention.

WORKING EXAMPLE

As a substrate 5, a Si wafer substrate and a glass substrate, on which a thermally oxide film having a thickness of 2 nm has been formed on the surface to be film formed thereof, is prepared. The substrate 5 is installed to a carrier 13 of an apparatus in FIG. 1. The inside of a vacuum chamber 11 is exhausted to $5 \times 10^{-5}$ Pa. Argon gas (at a flow rate of 110 sccm) as sputter gas and oxygen gas (at a flow rate of 90 sccm) as oxidizing gas are introduced from a gas feed system 18 so that a film forming ambience having a pressure of 0.67 Pa is formed inside of the vacuum chamber 11.

An alternating current power source of 1.5 kW (6.7 W per 1 $cm^2$ of cathode electrode surface area) was applied between two pairs of facing cathodes (first to fourth cathode electrodes 22a to 22d). The formation film is performed by passing the career 13 through the position facing to the opening 16 at a transfer speed of 15 mm/min. For the first to the fourth targets 21a to 21d, targets constituted of Si are used.

An $SiO_2$ film formed in the above-mentioned method was analyzed. It is found that the $SiO_2$ film is a good optical film that absorbs little light.

An Al electrode is formed by heated vapor deposition on the surface of the above-mentioned $SiO_2$ film that had been produced, and a CV measurement was performed. When comparing the results of a thermally oxidized film, good properties having a flat band shift of 0.04 V were obtained (FIG. 5).

Figure 7:
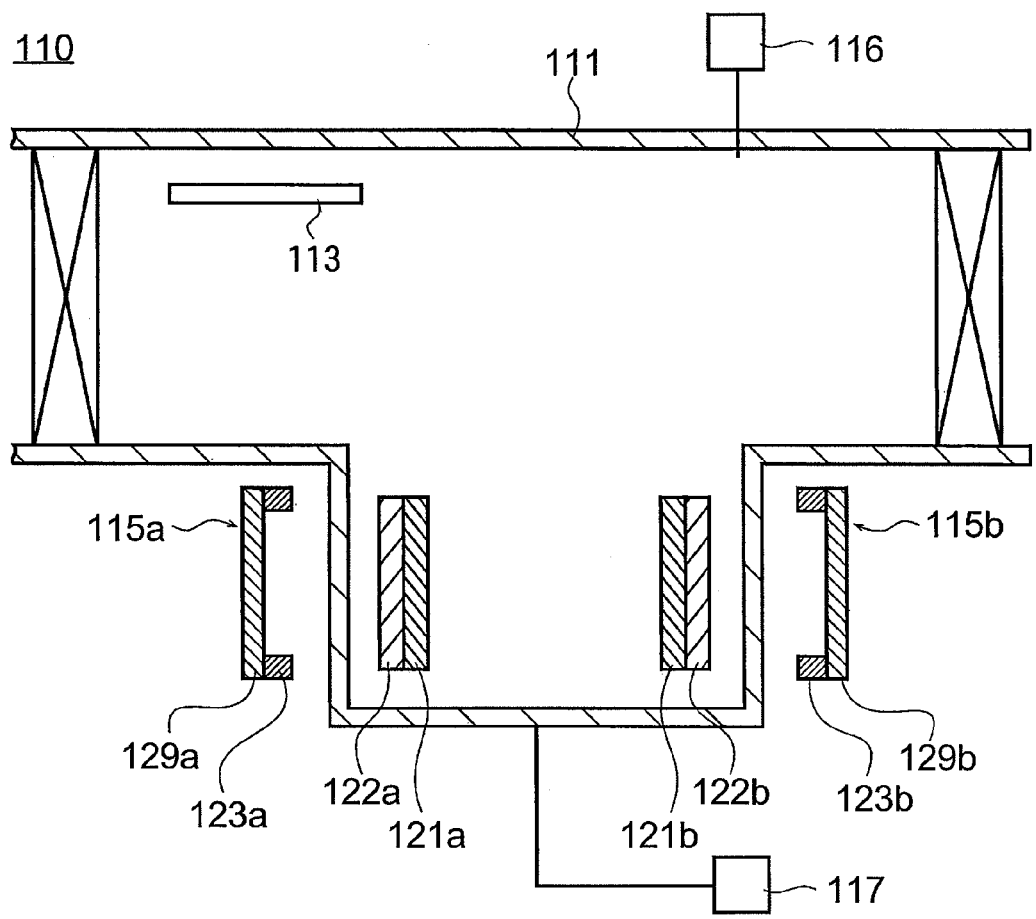
FIG. 7 shows a cross-sectional view of a conventional sputtering apparatus.

Using a conventional sputtering apparatus 110 that has a pair of facing targets as shown in FIG. 7, an $SiO_2$ film is formed. The gas flow rate used is the same as that used for the apparatus shown in FIG. 1. The power source applied is a direct current power source of 3.0 kW (6.7 W per 1 $cm^2$ of cathode electrode surface area). A film was formed by moving the substrate carrier at a transfer speed of 15 mm/minute.

Figure 5:
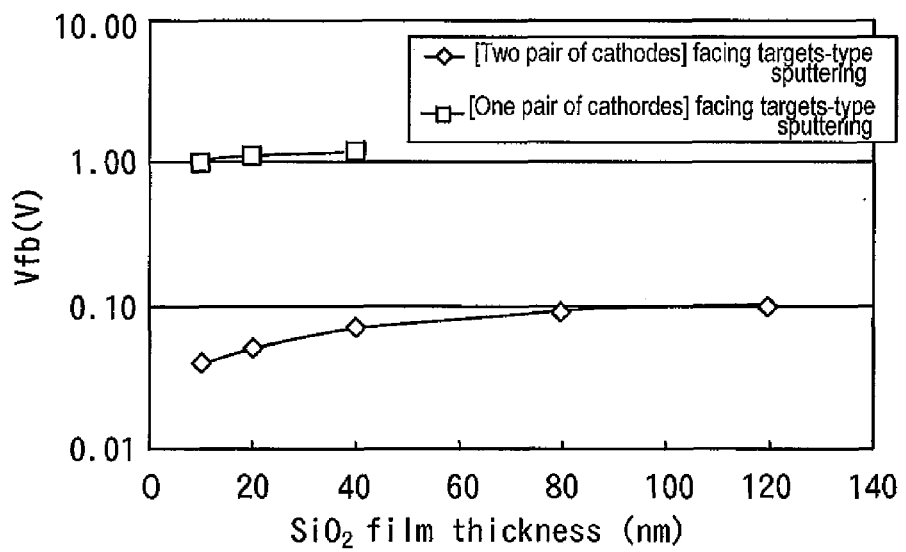
FIG. 5 is a graph that indicates the relationship between a flat band shift and the thickness of a dielectric film.

Although good properties that are equivalent to that of the apparatus shown in FIG. 1 are obtained, the flat band shift increased to 1.0 V (FIG. 5). It is clear that damage to the base film of the substrate 5 increases when the flat band shift is large. Furthermore, in the sputtering apparatus 110 shown in FIG. 7, there is a problem in that plasma cannot be stabilized since an SiO$_2$ film is deposited on the inner walls of the sputtering chamber.

The sputtering apparatus 1 according to the present invention and the conventional sputtering apparatus have equivalent film forming rates. Thus, if the sputtering apparatus 1 according to the present invention is used, a dielectric film with good optical properties can be formed without reducing the film forming rate. Furthermore, in the sputtering apparatus 1 according to the present invention, it is possible to form a film without damaging the substrate by abnormal discharges.

In addition, the substrate temperature was measured to analyze damages to the substrate 5 during film formation.

Hereinafter, the measuring conditions will be described. The carrier 13 is fixed at a location that faces the opening 16. A K thermocouple was installed to a location near the substrate 5 on the carrier 13. The K thermocouple is connected with a recorder, and the temperature rise during the film formation time is measured.

The film forming rates are equivalent between when the sputtering apparatus 1 according to the present invention is used and when the conventional sputtering apparatus 110 shown in FIG. 7 is used.

Figure 6:
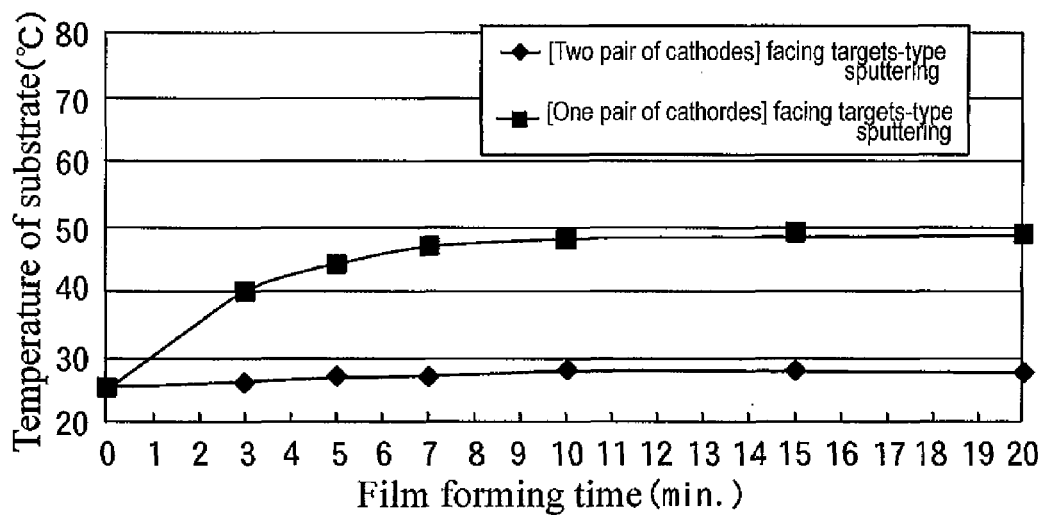
FIG. 6 is a graph that indicates the relationship between the temperature of a substrate and the time required for film forming.

FIG. 6 indicates that the temperature rise in the substrate 5 is smaller when the sputtering apparatus 1 according to the present invention is used than when the conventional sputtering apparatus 110 is used. It is thus clear that, in the sputtering apparatus 1 according to the present invention, it is possible to form a film at a lower temperature.

What is claimed is:

1. A sputtering apparatus, comprising:
    first and second targets that are disposed such that their surfaces face each other;
    a third target disposed such that its surface is in parallel with the surface of the first target;
    a fourth target disposed such that its surface is in parallel with the surface of the second target and the fourth target faces a surface of the third target; and
    first to fourth cathode electrodes that are disposed in a back face of the first to the fourth targets,
    wherein a film is formed on a surface of an object to be film formed at a location that faces a space between the first and the second targets,
    wherein the surface of the first target is positioned in a similar plane where the surface of the third target is positioned,
    wherein the surface of the second target is positioned in a similar plane where the surface of the fourth target is positioned,
    wherein the first and second targets are disposed between the object to be film formed on which the film is being formed and the third and the fourth targets, and
    wherein the sputtering particles discharged from the third and fourth targets pass through the space between the first and the second targets and reach the object to be film formed.

2. The sputtering apparatus according to claim 1, further comprising a transfer mechanism for moving the object to be film formed while the object to be film formed faces a space positioned between the first and the second targets.

3. The sputtering apparatus according to claim 1, wherein the third and the fourth targets are disposed such that the object to be film formed on which the film is being formed faces a space positioned between the third and the fourth targets.

4. The sputtering apparatus according to claim 3, further comprising a transfer mechanism for transferring the object to be film formed in such a manner that the object to be film formed simultaneously faces a space positioned between the first and the second targets as well as a space positioned between the third and the fourth targets has been provided.

5. The sputtering apparatus according to claim 1, further comprising a sputtering power source that is connected to the first to the fourth cathode electrodes and outputs an alternating current voltage,
    wherein the sputtering power source is connected so as to apply a voltage of the same polarity and of the same value as the first and the second cathode electrodes, and so as to apply a voltage of the same polarity and of the same value as the third and the fourth cathode electrodes.

6. The sputtering apparatus according to claim 5, wherein the sputtering power source outputs an alternate current voltage in such a manner that, when a negative voltage is applied to the first and the second cathode electrodes, a voltage that is positive relative to the first and the second cathode electrodes is applied to the third and the fourth cathode electrodes, and in such a manner that, when a negative voltage is applied to the third and the fourth cathode electrodes, a voltage that is positive relative to the third and the fourth cathode electrodes is applied to the first and the second cathode electrodes.

7. A method for forming a dielectric film using a sputtering apparatus, the sputtering apparatus including first and second targets disposed such that their surfaces face each other, a third target disposed such that its face is in parallel with the surface of the first target, and a fourth target disposed such that its surface is in parallel with the surface of the second target and faces the surface of the third target,
    the method for forming the dielectric film on a object to be film formed at a location facing a space between the first and the second targets, comprising the steps of:
    alternately repeating a first voltage period in which a negative voltage is applied to the first and the second targets and a voltage that is positive relative to the first and the second targets is applied to the third and the fourth targets, and a second voltage period in which a negative voltage is applied to the third and the fourth targets and a voltage that is positive relative to the third and the fourth targets is applied to the first and the second targets, while the sputtering particles discharged from the third and the fourth targets pass through the space between the first and the second targets so as to reach the object to be film formed,
    wherein the first and the second targets are disposed between the object to be film formed on which the dielectric film is being formed and the third and the fourth targets.

8. The film forming method according to claim 7, wherein the dielectric film is formed by moving the object to be film formed while film forming target faces a space between the first and the second targets.

9. The film forming method according to claim 8, wherein the first and the second voltage periods are respectively repeated at least twice while the leading end of the object to be film formed in the moving direction reaches a location that faces a space between the first and the second targets and the tail end of the object to be film formed in the moving direction completely passes through the location that faces a space between the first and the second targets.

10. The film forming method according to claim 7, wherein the surface of the first target is positioned in a similar plane where the surface of the third target is positioned, and wherein the surface of the second target is positioned in a similar plane where the surface of the fourth target is positioned.

* * * * *